(12) United States Patent
Nishio

(10) Patent No.: US 8,860,516 B2
(45) Date of Patent: Oct. 14, 2014

(54) PIEZOELECTRIC OSCILLATOR AND TRANSMITTER

(71) Applicant: Seiko Epson Corporation, Tokyo (JP)

(72) Inventor: Shinji Nishio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/755,565

(22) Filed: Jan. 31, 2013

(65) Prior Publication Data

US 2013/0162360 A1  Jun. 27, 2013

Related U.S. Application Data

(62) Division of application No. 12/174,401, filed on Jul. 16, 2008, now Pat. No. 8,384,486.

(30) Foreign Application Priority Data

Jul. 18, 2007 (JP) ................................. 2007-186593
Jan. 28, 2008 (JP) ................................. 2008-015871
May 26, 2008 (JP) ................................. 2008-136339

(51) Int. Cl.
*H03B 5/32* (2006.01)
*H03B 1/02* (2006.01)
*H03B 5/36* (2006.01)

(52) U.S. Cl.
CPC ... *H03B 1/02* (2013.01); *H03B 5/36* (2013.01)
USPC ................. 331/107 A; 331/167; 331/117 FE; 331/117 R; 331/108 C; 310/311; 257/416

(58) Field of Classification Search
USPC ............ 331/107 A, 107 DP, 154, 167, 108 C, 331/117 R, 117 FE; 257/416; 310/311
See application file for complete search history.

(56) References Cited

U.S. PATENT DOCUMENTS

| 5,867,074 | A | 2/1999 | Ogiso et al. |
| 6,965,274 | B2 | 11/2005 | Lee et al. |
| 7,145,406 | B2 * | 12/2006 | Kato ................... 331/107 A |
| 7,301,423 | B2 | 11/2007 | Furuhata et al. |
| 8,384,486 | B2 * | 2/2013 | Nishio .................. 331/107 A |

FOREIGN PATENT DOCUMENTS

| JP | A-62-199108 | 9/1987 |
| JP | A-07-297666 | 11/1995 |
| JP | A-09-162691 | 6/1997 |
| JP | A-10-190402 | 7/1998 |
| JP | A-11-330882 | 11/1999 |
| JP | B-3876552 | 4/2000 |
| JP | A-2000-114874 | 11/2006 |

* cited by examiner

*Primary Examiner* — Arnold Kinkead
(74) *Attorney, Agent, or Firm* — Oliff PLC

(57) ABSTRACT

A piezoelectric oscillator includes: a piezoelectric resonator element having a piezoelectric substrate and an excitation electrode formed on a surface of the piezoelectric substrate; a semiconductor circuit element provided with an oscillation circuit for oscillating the piezoelectric resonator element and having a first insulating film formed on a principal surface; a package for airtightly housing the semiconductor circuit element and the piezoelectric resonator element; and a protruding section having at least of a thin film circuit component formed on the first insulating film and connected to the oscillation circuit; and a second insulating film formed on the first insulating film and covering the thin film circuit component. In the oscillator, the piezoelectric resonator element is fixed to an upper surface of the protruding section.

16 Claims, 5 Drawing Sheets

PIEZOELECTRIC OSCILLATOR AND TRANSMITTER

This is a Division of application Ser. No. 12/174,401 filed Jul. 16, 2008, which claims the benefit of Japanese Application No. 2007-186593 filed Jul. 18, 2007, Japanese Application No. 2008-015871 filed Jan. 28, 2008, and Japanese Application No. 2008-136339 filed May 26, 2008. The disclosure of the prior applications is hereby incorporated by reference herein in its entirety.

BACKGROUND

1. Technical Field

The present invention relates to a piezoelectric oscillator and a transmitter equipped with the piezoelectric oscillator.

2. Related Art

In recent years, in order for coping with increase in communication speed associated with rapid development in the information-communication technology and the network technology, oscillators used for communication devices are required to be high-frequency devices and to have high stability. Surface acoustic wave (hereinafter also referred to as "SAW") oscillators, each of which is composed of a SAW resonator as a piezoelectric resonator element using a surface acoustic wave and a semiconductor circuit element (hereinafter referred to as "an IC chip") having an oscillating circuit for driving the SAW resonator as an integrated circuit, are widely used as the oscillators suitable to have a high-frequency property, and transmitters and so on equipped with the SAW oscillators are also used widely. Further, in accordance with a requirement of downsizing and low-profiling to communication devices such as cellular phones, in order for achieving further downsizing, an SAW oscillator having the SAW resonator and the IC chip housed in the same package is disclosed in, for example, JP-A-9-162691 (Document 1).

The SAW oscillator of the Document 1 is provided with a package composed of a package base and a lid member, an IC chip (LSI) having electrode pads (external connection electrodes) formed on a principal surface, and an SAW resonator (an SAW chip) having IDT electrodes and external connection terminals (input/output electrodes) connected to the IDT electrodes formed on a surface of a piezoelectric substrate. The IC chip is fixed to a concave bottom portion of a recess section of the package base. The SAW resonator is bonded on the IC chip via a plurality of bumps, and is held so as to form a space between the IC chip and a surface to which the SAW of the SAW resonator is propagated. Further, electrode pads of the IC chip and the external connection terminals of the SAW resonator are electrically connected to each other via the bumps. Further, since the package is formed by bonding the lid member on an opening section in the upper surface of the base, the IC chip and the SAW resonator are airtightly encapsulated inside the package.

Incidentally, in general, in the case in which the SAW oscillator is used for a transmitter, it is necessary that when connecting the output of the SAW oscillator and an antenna to each other, an impedance matching circuit is inserted therebetween to form a filter for reducing high-frequency loss and unnecessary radiation. Further, it is possible to obtain a variation range of the frequency by varying a load capacitance connected to the oscillation circuit for performing frequency control by varying the frequency of the SAW oscillator or realizing frequency modulation in a voltage controlled SAW oscillator, and it is known that an inductive element such as an extended coil is inserted between the SAW resonator and the oscillation circuit in order for obtaining a sufficient variation range.

As the circuit parameters such as resistances, capacitances, or inductances required to the circuit components such as resistor elements, capacitor elements, or inductive elements used in such cases, large values, which are difficult to form by integrating them in an IC chip using the CMOS process, are required. Therefore, since it is necessary to use the resistor elements, the capacitor elements, or the inductive elements formed as relatively large chip components, there is caused a problem that increase in mounting space is resulted, and thus downsizing of the piezoelectric oscillator or the transmitter using the piezoelectric oscillator becomes difficult.

Further, in the case in which downsizing of the piezoelectric oscillator or the transmitter using the piezoelectric oscillator is given greater importance, and the matching circuit is not incorporated therein, the matching circuit needs to be provided to the mounting circuit board of the counter part on which the piezoelectric oscillator or the transmitter using the piezoelectric oscillator is mounted, and there is caused a problem that the advantage of downsizing of the entire communication device is reduced by half.

SUMMARY

An advantage of the invention is to provide a piezoelectric oscillator including a matching circuit and a transmitter equipped with the piezoelectric oscillator.

A piezoelectric oscillator according to a first aspect of the invention includes: a piezoelectric resonator element having a piezoelectric substrate and an excitation electrode formed on a surface of the piezoelectric substrate; a semiconductor circuit element provided with an oscillation circuit for oscillating the piezoelectric resonator element, and having a first insulating film formed on a principal surface; a package for airtightly housing the semiconductor circuit element and the piezoelectric resonator element; and a protruding section having at least of a thin film circuit component formed on the first insulating film and connected to the oscillation circuit, and a second insulating film formed on the first insulating film and covering the thin film circuit component. In the oscillator, the piezoelectric resonator element is fixed to an upper surface of the protruding section.

According to this configuration, in the piezoelectric oscillator, since the semiconductor circuit element and the piezoelectric resonator element can be disposed in an overlapping manner in plan view by fixing the piezoelectric resonator element on the protruding section of the principal surface of the semiconductor circuit element provided with the oscillation circuit, the space efficiency inside the package is improved, thus downsizing of the package becomes possible. Therefore, downsizing of the piezoelectric oscillator becomes possible.

Further, in the piezoelectric oscillator, since the piezoelectric resonator element is fixed on the protruding section on the principal surface of the semiconductor circuit element, it is possible to provide the distance equivalent to the thickness of the protruding section between the principal surface of the semiconductor circuit element and piezoelectric resonator element. Thus, in the piezoelectric oscillator, since the collision between the semiconductor circuit element and the piezoelectric resonator element in response to, for example, the dropping impact becomes hard to occur. As a result, the impact resistance can be improved.

In addition, in the piezoelectric oscillator, since the thin film circuit component to be connected to the oscillation circuit is formed on the first insulating film, the circuit component with such a large circuit parameter as to cause difficulty in forming the circuit component in the semiconductor circuit element can be formed on the semiconductor circuit element. Thus, in the piezoelectric oscillator, since there is no need for mounting an external circuit component in the separate space inside the package, downsizing of the package becomes possible. Therefore, downsizing of the piezoelectric oscillator becomes possible.

In the piezoelectric oscillator, the piezoelectric resonator element is preferably fixed to the upper surface of the protruding section so that the piezoelectric resonator element is within a contour of the semiconductor circuit element in plan view.

According to this configuration, in the piezoelectric oscillator, since the piezoelectric resonator element can be within the contour of the semiconductor circuit element, the space efficiency in the package can further be improved, thus further downsizing of the package becomes possible. Therefore, further downsizing of the piezoelectric oscillator becomes possible.

In the piezoelectric oscillator, a spacing member is preferably interposed between the principal surface of the semiconductor circuit element and the first insulating film.

According to this configuration, since the spacing member is interposed between the principal surface side of the semiconductor circuit element and the first insulating film, the distance between the principal surface of the semiconductor circuit element and the piezoelectric resonator element can be increased by the thickness of the spacing member. Thus, in the piezoelectric oscillator, since the collision between the semiconductor circuit element and the piezoelectric resonator element in response to, for example, the dropping impact becomes harder to occur, the impact resistance can further be improved.

In the piezoelectric oscillator, the thin film circuit component is preferably an inductive element.

According to this configuration, in the piezoelectric oscillator, since the matching circuit for canceling the parasitic capacitance component included in the input/output impedance of the piezoelectric resonator element can be formed by the inductive element, the superior oscillation characteristic with reduced spurious component (unnecessary radiation) can be obtained.

In the piezoelectric oscillator, the inductive element is preferably an extended coil formed by patterning a metal film on the first insulating film.

According to this configuration, in the piezoelectric oscillator, the extended coil is formed by patterning the metal film to be a spiral shape using a photolithography technology, thereby adjusting the inductance accurately by controlling the line width. Further, in the piezoelectric oscillator, since the inductive element with smaller thickness compared to the chip type inductive element can thus be formed, low-profiling of the package can be achieved.

In the piezoelectric oscillator, the piezoelectric resonator element is preferably fixed to the protruding section via an adhesive so that the excitation electrode of the piezoelectric resonator element is located out of the upper surface of the protruding section in plan view.

According to this configuration, in the piezoelectric oscillator, since the piezoelectric resonator element is fixed thereto so that the excitation electrode is out of the upper surface of the protruding section in plan view, the adhesive can be prevented from flowing to the vicinity of the excitation electrode. Thus, in the piezoelectric oscillator, since the principal cause for blocking the vibration of the piezoelectric resonator element can be eliminated, a superior frequency characteristic can be obtained.

In the piezoelectric oscillator, the piezoelectric resonator element is preferably a surface acoustic element having an IDT electrode as the excitation electrode.

According to this configuration, in the piezoelectric oscillator, since the piezoelectric resonator element is a surface acoustic element having the IDT electrode as the excitation electrode, a surface acoustic wave (SAW) oscillator having a superior frequency characteristic in the high-frequency band can be provided.

In the piezoelectric oscillator, it is preferable that the piezoelectric resonator element be a surface acoustic element having an IDT electrode as the excitation electrode, and the thin film circuit component be an extended coil formed by patterning a metal film on the first insulating film, and connected between the surface acoustic element and the oscillation circuit.

According to this configuration, a small-sized voltage controlled SAW oscillator having a sufficient frequency variation range can be realized.

In the piezoelectric oscillator, it is preferable that an electrode land be formed on the first insulating film, and the electrode land be exposed through an opening section provided to the second insulating film.

According to this configuration, in the piezoelectric oscillator, the electrode land is formed on the first insulating film, and the electrode land is exposed from the opening section provided to the second insulating film. Therefore, in the piezoelectric oscillator, the circuit component chip connected to the oscillation circuit or the like can be mounted on the semiconductor circuit element via the electrode land. Thus, in the piezoelectric oscillator, the space efficiency in the package can further be improved, and further downsizing of the package becomes possible. Therefore, further downsizing of the piezoelectric oscillator becomes possible.

In the piezoelectric oscillator, at least an inductive element as a circuit component chip is preferably bonded to the electrode land.

According to this configuration, in the piezoelectric oscillator, since the inductive element is bonded to the electrode land, the matching circuit for canceling the parasitic capacitance included in the input/output impedance of the piezoelectric resonator element can be formed by the inductive element. Thus, in the piezoelectric oscillator, a superior oscillation characteristic with suppressed spurious component can be obtained.

In the piezoelectric oscillator, the semiconductor circuit element is preferably bonded face down to an inside bottom of the package.

According to this configuration, in the piezoelectric oscillator, since the semiconductor circuit element is bonded face down to the inside bottom of the package, the low-profile chip scale packaging of the semiconductor circuit element becomes possible. Thus, in the piezoelectric oscillator, further downsizing and low-profiling can be achieved.

A transmitter according to a second aspect of the invention includes an oscillator for outputting a transmission signal, and an antenna for emitting the transmission signal from the oscillator as an electromagnetic wave, and the oscillator is formed of the piezoelectric oscillator described above.

According to this configuration, since the transmitter has the piezoelectric oscillator described above built-in, by having the matching circuit built-in, for example, a small-sized transmitter having superior oscillation property can be provided.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

Hereinafter, an embodiment of the SAW oscillator as a piezoelectric oscillator will be explained with reference to the accompanying drawings.

First Embodiment

Figure 1A:
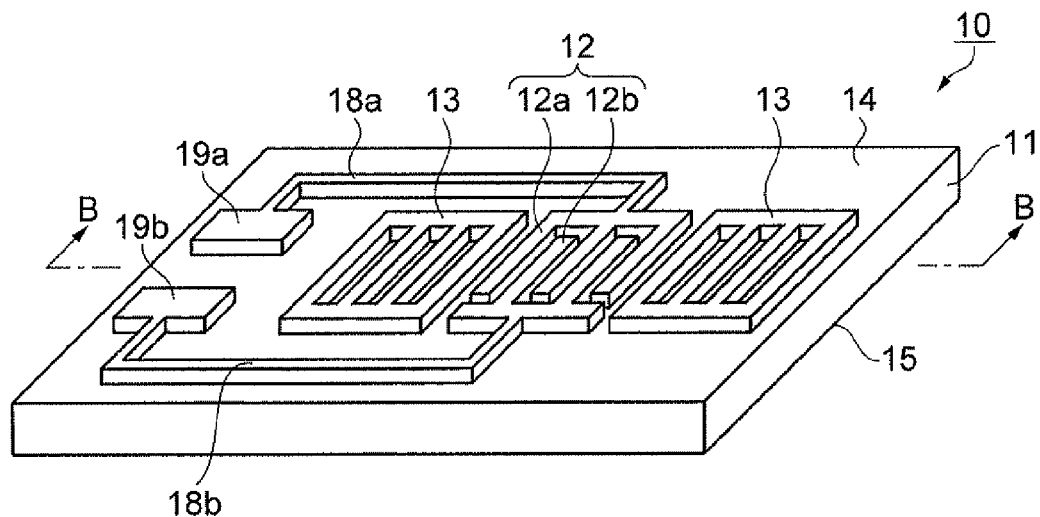
FIG. 1A is a perspective view for explaining an SAW resonator as a piezoelectric resonator element according to a first embodiment of the invention.
Figure 1B:
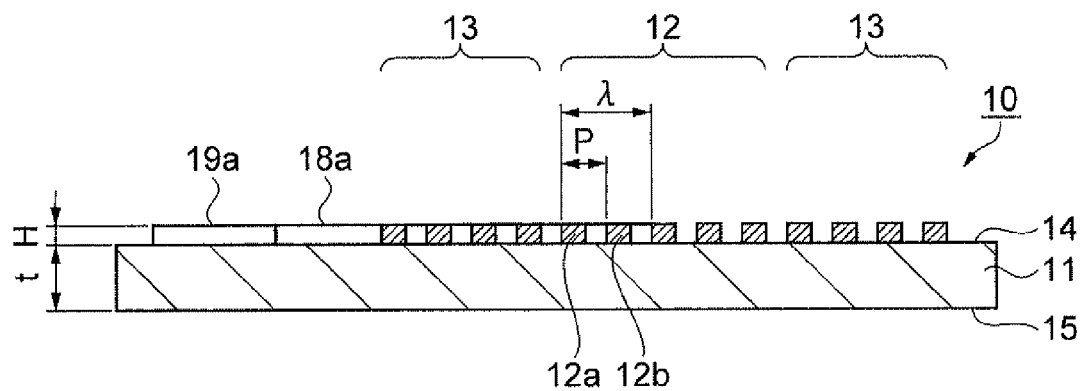
FIG. 1B is a cross-sectional view along the B-B line shown in FIG. 1A.
Figure 2A:
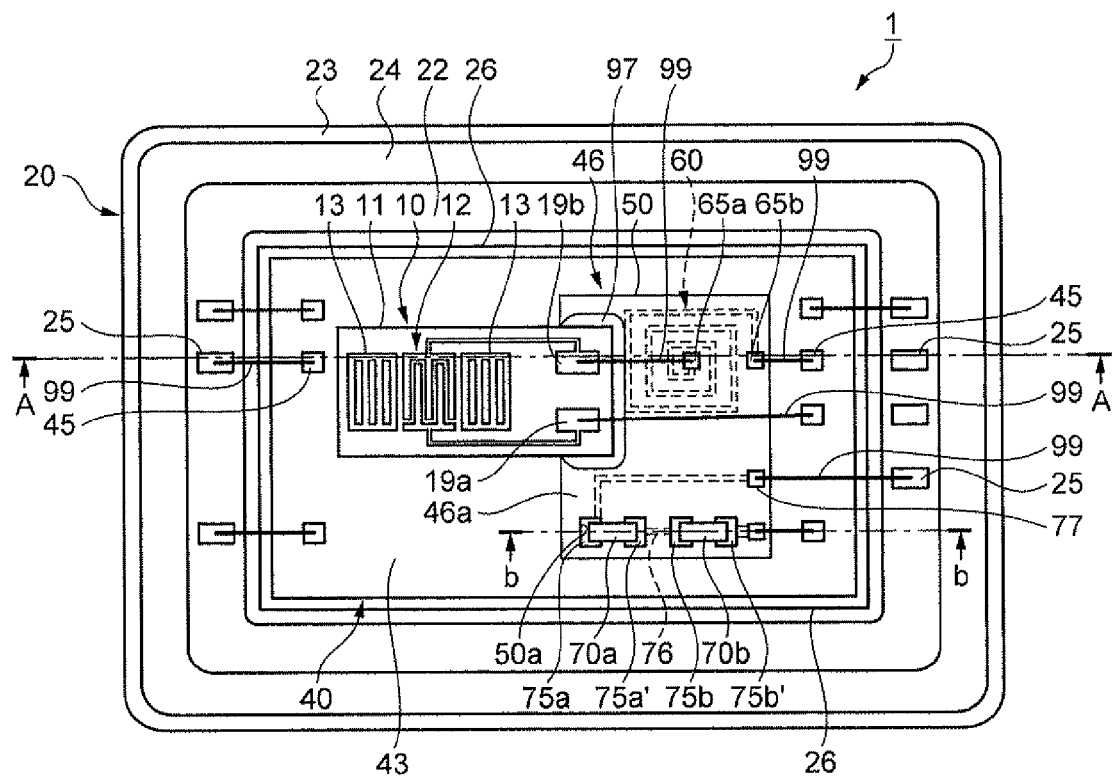
FIG. 2A is a plan view for explaining the SAW oscillator according to the first embodiment of the invention.
Figure 2B:
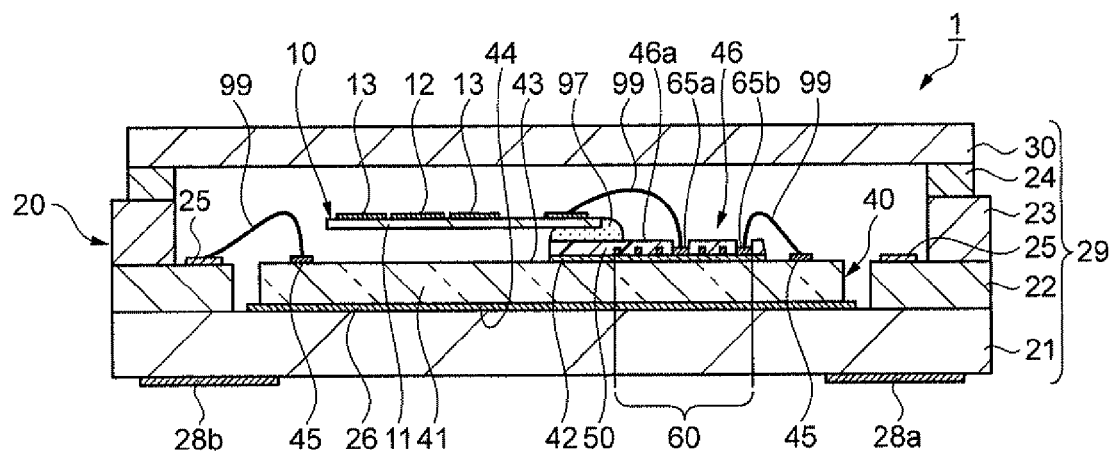
FIG. 2B is a cross-sectional view along the A-A line shown in FIG. 2A.
Figure 3:
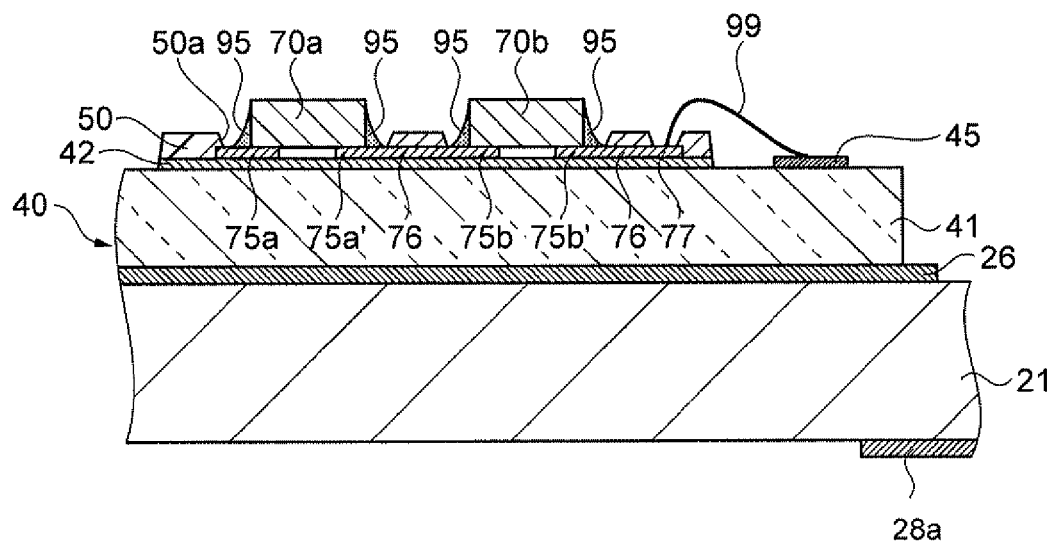
FIG. 3 is a cross-sectional view along the b-b line shown in FIG. 2A, enlarging the part of the SAW oscillator according the first embodiment, on which circuit component chips are mounted, for explaining the part.

FIGS. 1A and 1B are diagrams for explaining the SAW resonator as the piezoelectric resonator element mounted on the SAW oscillator according to the present embodiment, wherein FIG. 1A is a perspective view, and FIG. 1B is a cross-sectional view along the B-B line shown in FIG. 1A. Further, FIGS. 2A and 2B are diagrams for explaining the SAW oscillator according to the present embodiment, wherein FIG. 2A is a plan view, and FIG. 2B is a cross-sectional view along the A-A line shown in FIG. 2A. It should be noted that in FIG. 2A, a metal lid as a lid member disposed on the upper part of the SAW oscillator is omitted from illustration for the sake of convenience of explanation of the internal configuration of the SAW oscillator. Further, FIG. 3 is a cross-sectional view along the b-b line shown in FIG. 2A, enlarging the part of the SAW oscillator according the present embodiment, on which circuit component chips are mounted, for explaining the part.

SAW Resonator

Firstly, in the SAW oscillator according to the present embodiment, the SAW resonator for generating a predetermined reference frequency will be explained.

As shown in FIG. 1A, the SAW resonator 10 is provided with an IDT electrode 12 as an excitation electrode, reflectors 13, and a pair of external connection terminals 19a, 19b disposed on a rectangular piezoelectric substrate 11 made of a piezoelectric material such as quartz crystal.

The piezoelectric substrate 11 has principal faces 14, 15 as surfaces, and the IDT electrode 12, the reflectors 13, and the external connection terminals 19a, 19b are formed on the principal face 14 out of the principal faces 14, 15.

The IDT electrode 12 has a pair of comb-like interdigital electrodes, and a plurality of electrode fingers 12a coupled to each other by a bus bar of one of the interdigital electrodes and a plurality of electrode fingers 12b coupled to each other by a bus bar of the other of the interdigital electrodes are arranged to face each other without having contact with each other.

The IDT electrode 12 is made of aluminum (Al), and is configured to be able to excite a surface acoustic wave by applying voltages with reversed phase respectively to the electrode fingers 12a and the electrode fingers 12b of the pair of interdigital electrodes.

The external connection terminal 19a is connected to the bus bar coupling the electrode fingers 12a, one of the electrode fingers of the IDT electrode 12, via an inter-electrode wiring 18a, and the external connection terminal 19b is connected to the bus bar coupling the electrode fingers 12b, the other of the electrode fingers of the IDT electrode 12, via an inter-electrode wiring 18b.

The reflectors 13 are formed so as to be disposed on both sides of the IDT electrode 12 interposed therebetween. Further, the reflectors 13 have a function of reflecting the surface acoustic waves propagated from the IDT electrode 12, thereby containing the energy in the center portion of the piezoelectric substrate 11. It should be noted that the reflectors 13 is also made of aluminum similar to the IDT electrode 12.

As shown in FIG. 1B, the distances between the electrode fingers 12a and the electrode fingers 12b are arranged to have the same pitch P, and the wavelength $\lambda=2P$ of the excited surface acoustic wave has a relationship represented as $\lambda=2P$. Further, the IDT electrode 12 is formed to have a thickness of H. Further, the thickness t of the piezoelectric substrate 11 is set to be four times $(4\lambda)$ of the wavelength of the surface acoustic wave or larger.

SAW Oscillator

Hereinafter, the SAW oscillator according to the present embodiment will be explained.

As shown in FIGS. 2A and 2B, the SAW oscillator 1 is provided with a package base 20, an IC chip 40 as a semiconductor circuit element fixed to a concave bottom portion of a recess section of the package base 20, and the SAW resonator 10 fixed on a protruding section 46 formed on one principal surface 43 of the IC chip 40.

The IC chip 40 is provided with a oscillation circuit for exciting the SAW resonator 10.

The protruding section 46 is configured including a first insulating film 42 formed on a part of the one principal surface 43 of the IC chip 40 to have a substantially rectangular shape, an extended coil 60 as an inductive element, which is a thin film circuit component formed on the first insulating film 42 and connected to the oscillation circuit, and a second insulating film 50 formed on the first insulating film 42 to have a substantially rectangular shape and covering the extended coil 60.

Further, the protruding section 46 has an upper surface 46a formed to be substantially flat, and substantially parallel to the principal surface 43 of the IC chip 40.

Further, the protruding section 46 is provided with a plurality of pairs of electrode lands 75a, 75a', 75b, 75b' formed on the first insulating film 42 so as to be exposed through opening sections 50a provided to the second insulating film 50.

To these electrode lands 75a, 75a', 75b, 75b', there is bonded a plurality of circuit component chips 70a, 70b such as a chip resistor element or a chip capacitor element.

Further, the SAW oscillator 1 has the IC chip 40 and the SAW resonator 10 airtightly encapsulated inside the package 29 by bonding the metal lid 30 as the lid member on the package base 20 to form the package 29.

The package base 20 is composed of a first layer substrate 21 having a substantially rectangular planar shape and made, for example, of a ceramic insulating material, a second layer substrate 22 and a third layer substrate 23 each having a substantially rectangular frame-like shape, and a seal ring 24 stacked in this order.

Further, on the bottom surface of the first layer substrate 21 forming an outer bottom portion of the package base 20, there is provided a pair of mounting terminals 28a, 28b, and at substantially central portion of the upper surface of the first layer substrate 21 forming the concave bottom portion of the recess section of the package base 20, there is provided a die pad 26.

Further, on the second layer substrate 22 of the package base 20, there is provided a plurality of connection terminals 25. The connection terminals 25 are connected respectively to the mounting terminals 28a, 28b corresponding thereto via wiring patterns or in-layer wiring such as through holes not shown in the drawings.

The connection terminals 25, the mounting terminals 28a, 28b, and wiring patterns for connecting these terminals are typically formed by printing a metal wiring material such as tungsten (W) or molybdenum (Mo) on the ceramic insulating material by screen printing, calcining the material, and then executing plating of nickel (Ni), gold (Au), or the like on the material.

On the die pad 26, there is fixed the IC chip 40, which has the integrated circuit including the oscillation circuit described above provided to a semiconductor substrate 41 made of silicon and a plurality of electrode pads 45 provided to the surface thereof, with a thermoset adhesive with the other principal surface 44 facing downward.

On the first insulating film 42 of the protruding section 46, there is formed the extended coil 60 provided with a connection terminal 65a on one end thereof, formed to have a shape of a spiral starting from the connection electrode 65a, and further provided with a connection electrode 65b at the other end thereof as the terminal point of the spiral.

The extended coil 60 can be formed by stacking a metal film on the first insulating film 42 using a sputtering method or the like, and then patterning the metal film using a photolithography technology. The extended coil 60 formed in this manner can be formed to have the width and the shape of the pattern controlled with relative ease and good accuracy, and consequently, can be formed as an inductor adjusted to have an accurate inductance at low cost. In addition, the extended coil 60 can be formed thinner than the chip type inductive element.

Further, the extended coil 60 can be formed as a component with such a large circuit parameter as to cause difficulty when being formed in the IC chip 40.

It should be noted that in the case in which the SAW oscillator 1 is a voltage controlled SAW oscillator the oscillating frequency of which varies in accordance with a control voltage input from the outside, it is preferable that the extended coil 60 is inserted between the SAW resonator 10 and the oscillating circuit formed in the IC chip 40 in order for obtaining the sufficient range of variation of the frequency of the voltage controlled SAW oscillator.

It should be noted that materials having an insulating property such as polyimide resin, silicone modified polyimide resin, epoxy resin, silicone modified epoxy resin, acrylic resin, or phenol resin can preferably be used for the first insulating film 42, and the polyimide resin is more preferably used therefor. According to this configuration, since the thermal conductivity of the polyimide resin is lower than that of the IC chip 40, it is hard for the heat of the IC chip 40 to be conducted to the SAW resonator 10 fixed to the protruding section 46.

Further, the metal wiring materials such as aluminum (Al), gold (Au), silver (Ag), nickel (Ni), or copper (Cu) can preferably be used for the extended coil 60, and in view of suppression of energy loss, the metal material with lower specific resistance among these materials is preferably used.

On the first insulating film 42, there is formed the second insulating film 50 for which the same material as that of the first insulating film 42 is used so as to cover the extended coil 60.

As shown in FIG. 3, in an area on the first insulating film 42 not overlapping the extended coil 60 (see FIGS. 2A and 2B) in plan view, there is formed the circuit wiring by stacking a metal material using, for example, a sputtering method, and then patterning the metal material with a photolithography technology.

The circuit wiring of the present embodiment includes the plurality of pairs of electrode lands 75a, 75a', 75b, 75b' and a connection electrode 77. Further, in the present embodiment, some electrode lands 75a', 75b are connected to each other via inter-terminal wiring 76, and some electrode lands 75b' except these electrode lands 75a', 75b are connected to the connection electrode 77 via the inter-terminal wiring 76.

On such circuit wiring, the second insulating film 50 described above is formed so as to have the opening sections 50a for exposing the electrode lands 75a, 75a', 75b, 75b', and the connection electrode 77.

The pair of electrode lands 75a, 75a' and the pair of electrode lands 75b, 75b' are provided respectively with the circuit component chips 70a, 70b such as a chip resistor or a chip capacitor bonded with solder 95. It should be noted that the bonding material for bonding the circuit component chips 70a, 70b is not limited to the solder 95, but a conductive adhesive or the like can also be used therefor.

It should also be noted that formation of the circuit wiring except the extended coil 60 can be eliminated, and mounting of the circuit component chips 70a, 70b can also be eliminated depending on the circuit configuration.

Going back to FIGS. 2A and 2B, on the upper surface 46a (the upper surface of the second insulating film 50) of the protruding section 46, one end of the SAW resonator 10 provided with the external connection terminals 19a, 19b is fixed with an insulating adhesive 97.

On this occasion, the SAW resonator 10 is fixed thereto in a cantilever support condition in substantially parallel to the one principal surface 43 of the IC chip 40 so that the IDT electrode 12 and the upper surface 46a of the protruding section 46 do not overlap with each other in plan view. Thus, there is provided a distance equivalent to a sum of the thickness of the protruding section 46 and the thickness of the adhesive 97 between the SAW resonator 10 and the one principal surface 43 of the IC chip 40. Further, the SAW resonator 10 is fixed to the protruding section 46 so as to be contained within the contour of the IC chip 40 in plan view.

The external connection terminal 19a of the SAW resonator 10 is connected to corresponding one of the electrode pads 45 of the IC chip 40 with a bonding wire 99. Further, the external connection terminal 19b is connected to the connection electrode 65a of the extended coil 60 with a bonding wire 99, and since the connection terminal 65b of the extended coil 60 and the corresponding one of the electrode pads 45 of the IC chip 40 are connected to each other with a bonding wire 99, the external connection terminal 19b is connected to the electrode pad 45 via the extended coil 60.

Further, the connection electrode 77 and some of the plurality of electrode pads 45 of the IC chip 40 are connected respectively to the corresponding connection terminals 25 of the package base 20 with bonding wires 99.

By such connection with the bonding wires 99, the integrated circuit of the IC chip 40, the SAW resonator 10, and the circuit wiring including the extended coil 60 formed on the IC chip 40 are connected to each other, thus a single circuit including the oscillation circuit of the SAW oscillator 1 is formed on the package base 20. Among these constituents, the matching circuit for canceling the parasitic capacitance component included in the input/output impedance of the SAW resonator 10 is formed in the circuit wiring on the IC chip 40 with the extended coil 60 and the circuit component chips 70a, 70b.

On the upper side of the package base 20, the metal lid 30 is seam-welded via the seal ring 24 formed by die-cutting an iron-nickel (Fe—Ni) alloy or the like to form the package 29, thus the IC chip 40 and the SAW resonator 10 bonded inside the package 29 are airtightly encapsulated.

By providing the SAW oscillator 1 with the configuration described above in which the SAW resonator 10 easily generating high frequency wave in principle is used as the piezoelectric resonator element, the SAW oscillator 1 shows superior frequency characteristic in the high frequency band.

As described above, in the SAW oscillator according to the first embodiment, by fixing the SAW resonator 10 on the protruding section 46 of the one principal surface 43 of the IC chip 40, the IC chip 40 and the SAW resonator 10 can be arranged so as to overlap with each other in plan view, and thus, the space efficiency in the package base 20 can be improved to achieve downsizing of the package 29. Therefore, downsizing of the SAW oscillator 1 becomes possible.

In addition, in the SAW oscillator 1, since the SAW resonator 10 can be contained within the contour of the IC chip 40 in plan view, the space efficiency in the package base 20 can further be improved compared to the case in which the SAW resonator 10 does not contained within the contour of the IC chip 40, and further downsizing of the package 29 becomes possible. Therefore, further downsizing of the SAW oscillator 1 becomes possible.

Further, in the SAW oscillator 1, since the SAW resonator 10 is fixed so that the upper surface 46a of the protruding section 46 and the IDT electrode 12 do not overlap with each other in plan view, the adhesive 97 can be prevented from flowing in to a space right under the IDT electrode 12. Thus, since the SAW oscillator 1 can suppress the influence of the stress caused by the thermal contraction of the adhesive 97, which disturbs the vibration of the SAW resonator 10, the superior frequency characteristic can be obtained.

Further, in the SAW oscillator 1, since the SAW resonator 10 is fixed on the protruding section 46 of the one principal surface 43 of the IC chip 40, the distance between the one principal surface 43 of the IC chip 40 and the SAW resonator 10 equivalent to the sum of the thickness of the adhesive 97 and the thickness of the protruding section 46 can be provided. Thus, in the SAW oscillator 1, since the collision between the IC chip 40 and the SAW resonator 10 in response, for example, to the dropping impact becomes hard to occur, the impact resistance can be improved.

Further, in the SAW oscillator 1, since the extended coil 60 with such a large circuit parameter as to as to cause difficulty when being formed in the IC chip 40 is formed on the first insulating film 42, and the circuit component chips 70a, 70b are mounted on the IC chip 40, there is no need for mounting the external circuit component in another space in the package base 20. Therefore, in the SAW oscillator 1, further downsizing of the package 29 becomes possible.

Further, in the SAW oscillator 1, by providing the extended coil 60 as an inductive element, it becomes possible to incorporate an additional filter circuit for reducing a spurious component included in the output of the SAW oscillator 1. Thus, in the SAW oscillator 1, since the matching circuit for canceling the parasitic capacitance component included in the input/output impedance of the SAW resonator 10 can be formed, the superior oscillation characteristic with reduced spurious component can be obtained.

Further, in the SAW oscillator 1, the extended coil 60 is formed by patterning the metal film to be a spiral shape using a photolithography technology, thereby adjusting the inductance accurately by controlling the line width of the pattern. Further, in the SAW oscillator 1, since the inductive element with smaller thickness compared to the chip type inductive element can thus be formed, low-profiling of the package 29 can be achieved.

It should be noted that although each of the circuit component chips 70a, 70b is assumed as a chip resistor, a chip capacitor, or the like in the first embodiment, it is possible to assume each of the circuit component chips 70a, 70b as an inductive element.

According to this configuration, in the SAW oscillator 1, it becomes possible to easily form the matching circuit for canceling the parasitic capacitance included in the input/output impedance of the SAW resonator 10 using the circuit component chips 70a, 70b instead of the extended coil 60.

First Modified Example

Figure 4:
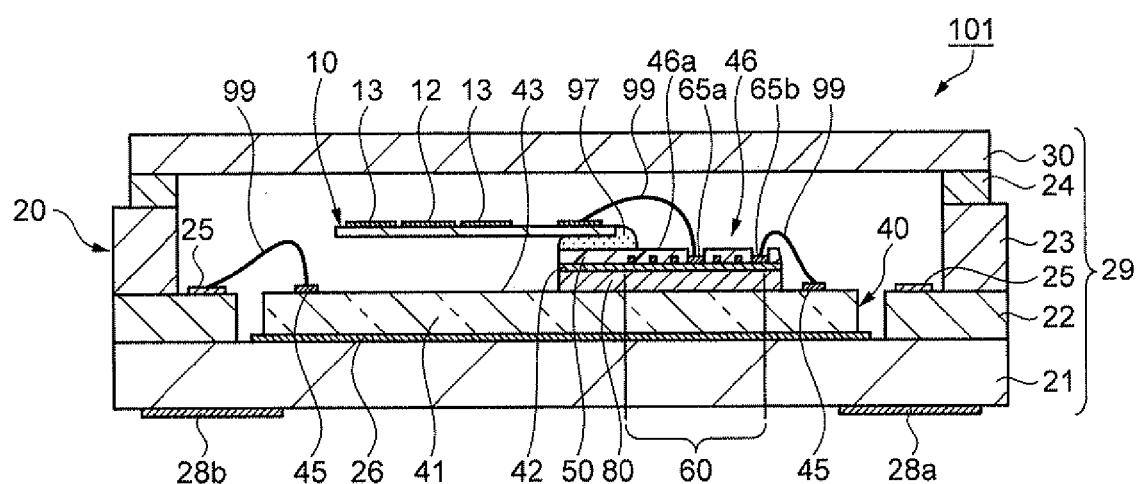
FIG. 4 is a cross-sectional view of an SAW oscillator according to a first modified example of the first embodiment.

Here, a first modified example of the first embodiment of the invention will be explained with reference to the drawing. FIG. 4 is a cross-sectional view of an SAW oscillator according to the first modified example of the first embodiment. It should be noted that the common sections to the first embodiment are denoted with the same reference numerals, the explanations therefor will be omitted, and different sections will mainly be explained.

As shown in FIG. 4, the SAW oscillator 101 according to the first modified example of the first embodiment has a spacing member 80 interposed between the one principal surface 43 of the IC chip 40 and the first insulating film 42. As the spacing member 80, a silicon substrate or the like is used. The spacing member 80 is fixed to the one principal surface 43 of the IC chip 40 with an adhesive not shown in the drawing.

It should be noted that it is preferable that the spacing member 80 is fixed to the IC chip 40 after the first insulating film 42, the extended coil 60, the second insulating film 50, and so on have been formed on the spacing member 80.

According to this configuration, in the SAW oscillator 101, the distance between the one principal surface 43 of the IC chip 40 and the SAW resonator 10 can be increased by the thickness of the spacing member 80 compared to the first embodiment. Thus, in the SAW oscillator 101, since the collision between the IC chip 40 and the SAW resonator 10 in response, for example, to the dropping impact becomes harder to occur, the impact resistance can further be improved.

Second Modified Example

Then, a second modified example of the first embodiment of the invention will be explained with reference to the drawing.

Figure 5:
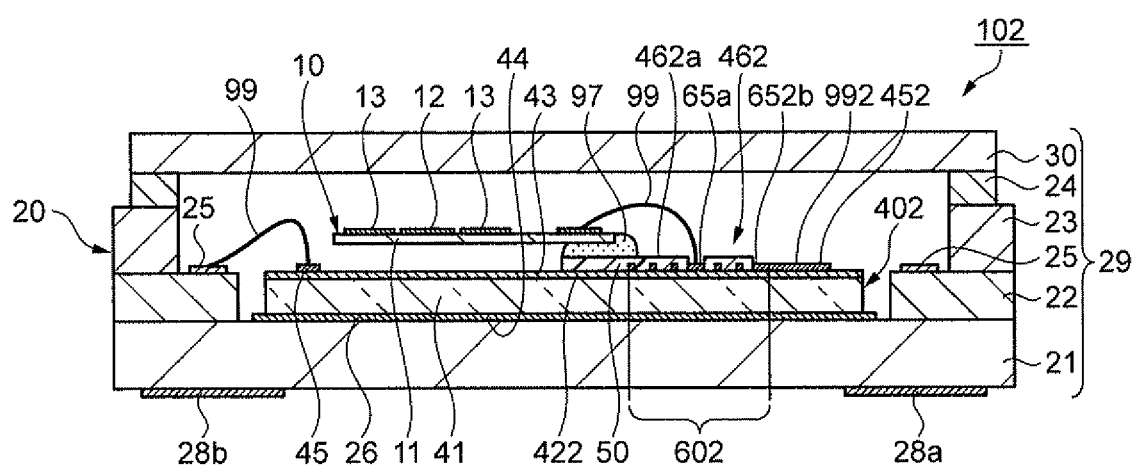
FIG. 5 is a cross-sectional view of an SAW oscillator according to a second modified example of the first embodiment.

FIG. 5 is a cross-sectional view of an SAW oscillator according to the second modified example of the first embodiment. It should be noted that the common sections to the first embodiment are denoted with the same reference numerals, the explanations therefor will be omitted, and different sections will mainly be explained.

As shown in FIG. 5, the SAW oscillator 102 according to the second modified example of the first embodiment has the first insulating film 422 formed on the entire one principal surface 43 of the IC chip 402.

In such a case, the extended coil 602 as the inductive element, which is a thin film circuit component connected to the oscillation circuit described above, is formed on the first insulating film 422. Further, the protruding section 462 is formed on the extended coil 602 and the first insulating film 422 so as to have a substantially rectangular shape, and is configured additionally including the second insulating film 50 covering the extended coil 602.

Further, the protruding section 462 has an upper surface 462a formed to be substantially flat, and substantially parallel to the principal surface 43 of the IC chip 402.

It should be noted that the connection electrode 652b as an end of the extended coil 602 and the electrode pad 452 of the oscillation circuit are electrically connected to each other with the connection electrode pattern 992.

In the SAW oscillator 102 having such a configuration, since the extended coil 602 is formed on the first insulating film 422 as an insulating film provided to a typical IC chip, the number of layers of the insulating film for forming the protruding section 462 can be reduced. Therefore, the manufacturing process can be made easy and simple. Further, the connection electrode 652b and the electrode pad 452 of the oscillation circuit are electrically connected to each other with the connection electrode pattern 992. Since the connection electrode 652b, the connection electrode pattern 992, and the electrode pad 452 of the oscillation circuit are formed as a single metal pattern using a photolithography method or the like, the reliability of the electrical connection is improved compared to the case in which the connection electrode and the electrode pad are connected with a bonding wire.

Second Embodiment

In the SAW oscillator 1 according to the first embodiment of the invention, the IC chip 40 is bonded to the package base 20 in the condition in which the one principal surface 43 of the IC chip 40 as the surface (an active surface), on which the integrated circuit and a plurality of electrode pads 45 are formed, faces the metal lid 30, and then the protruding section 46 and so on are provided to the one principal surface 43.

Besides the case with the first embodiment, it is possible that the SAW oscillator has a configuration in which the IC chip is bonded to the package base using a face-down bonding process, and then the protruding section and so on are provided to a different surface from the active surface of the IC chip.

Figure 6A:
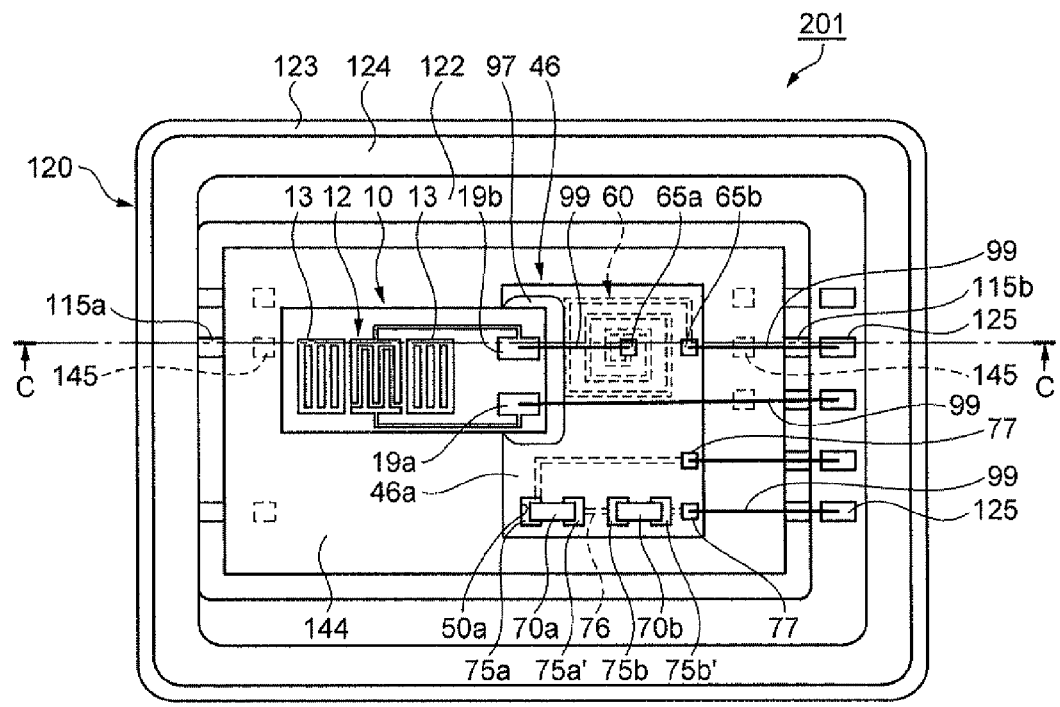
FIG. 6A is a plan view for explaining an SAW oscillator according to a second embodiment of the invention.
Figure 6B:
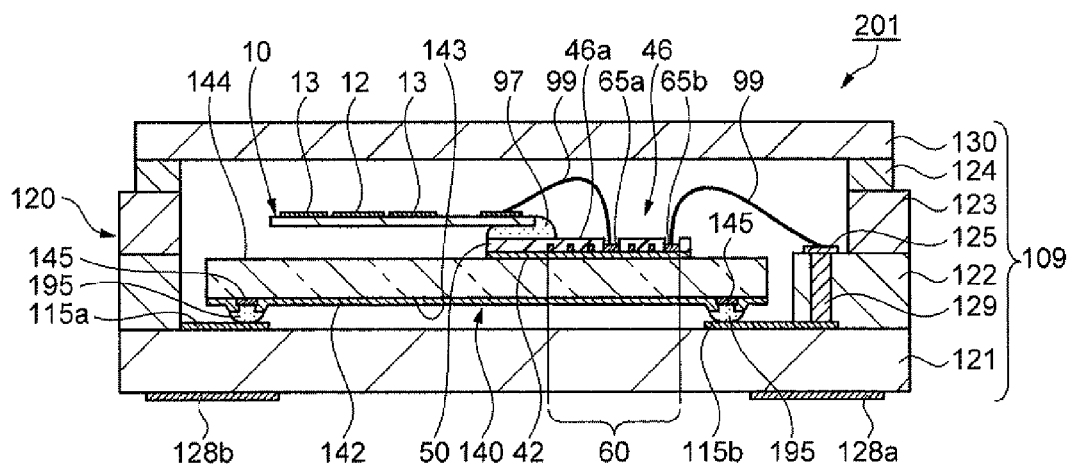
FIG. 6B is a cross-sectional view along the C-C line shown in FIG. 6A.

FIGS. 6A and 6B are diagrams for explaining an SAW oscillator according to a second embodiment of the invention, wherein FIG. 6A a plan view, and FIG. 6B is a cross-sectional view along the C-C line shown in FIG. 6A. It should be noted that since the SAW oscillator according to the present embodiment has the common configuration to that of the first embodiment except the fact that the surface of the IC chip with which the IC chip is bonded to the package base and the surface of the IC chip on which the protruding section is disposed are different, the common sections to the first embodiment are denoted with the same reference numerals, the explanations therefor will be omitted, and different sections will mainly be explained.

As shown in FIG. 6, the SAW oscillator 201 according to the second embodiment has a package base 120, the IC chip 140 bonded face down to the concave portion of the recess section of the package base 120 via the bonding material 195, and the SAW resonator 10 fixed on the protruding section 46 of the IC chip 140 in a cantilever support condition.

Further, on the other principal surface 144 as the reverse side of the IC chip 140 bonded face down thereto, there are disposed the circuit wiring including the extended coil 60 formed on the first insulating film 42, and a plurality of pairs of electrode lands 75a, 75a', 75b, 75b' exposed through the opening sections 50a of the second insulating film 50 formed on the first insulating film 42, and the plurality of circuit component chips 70a, 70b bonded respectively thereto.

Further, the IC chip 140 and the SAW resonator 10 are airtightly encapsulated inside the package 109 by bonding the metal lid 130 on the package base 120 to form the package 109.

In FIG. 6B, the package base 120 is composed of the first layer substrate 121 having a substantially rectangular planar shape and made, for example, of a ceramic insulating material, the second layer substrate 122 and the third layer substrate 123 each having a substantially rectangular frame-like shape, and the seal ring 124 stacked in this order. Further, on the bottom surface of the first layer substrate 121 forming an outer bottom portion of the package base 120, there is provided the pair of mounting terminals 128a, 128b, and on the first layer substrate 121 forming the concave bottom portion of the recess section of the package base 120, there is provided a plurality of connection terminals 115a, 115b to which the IC chip 140 is bonded.

Further, on the second layer substrate 122 in the package base 120, there is provided a plurality of connection terminals 125. The connection terminals 125 of the second layer substrate 122 and the corresponding connection terminals 115a, 115b of the first layer substrate 121 are connected respectively to each other with the in-layer wiring 129 such as through holes formed so as to penetrate the second layer substrate 122.

Further, some of the plurality of connection terminals 125 of the second layer substrate 122 and the plurality of connection terminals 115a, 115b of the first layer substrate 121 are connected to the corresponding mounting terminals 128a, 128b, respectively, with wiring patterns, not shown in the drawings, formed on the second layer substrate 122 and the first layer substrate 121 or the in-layer wiring patterns such as the through holes.

On the one principal surface 143, which is the active surface provided with the integrated circuit such as the oscillation circuit of the IC chip 140, there is disposed a plurality of electrode pads 145, and on the substantially entire area of the one principal surface 143, there is formed an insulating film 142 made, for example, of silicon oxide or silicon nitride so as to have opening sections for exposing the electrode pads 145. Further, on each of the electrode pads 145, there is formed the bonding material 195 such as a gold (Au) bump in the aligned level.

The IC chip 140 is bonded face down by positioning the bonding materials 195 to the corresponding connection terminals 115a, 115b, and then heating and pressurizing the bonding materials 195.

It should be noted that the bonding material 195 is not limited to the gold bump, but can be a bump made of other metals, a resin core bump having a conductive film formed on the surface of a resin core, or the like, or a configuration of bonding the IC chip 140 using a conductive adhesive or the like as the bonding material can also be adopted.

Further, it is possible to reinforce the bonding strength of the IC chip 140 by filling the gap between the IC chip 140 thus bonded face down and the package base 120 with an underfill material and then curing the underfill material.

On a part of the other principal surface 144 of the IC chip 140 thus bonded face down thereto, there is formed the protruding section 46 similarly to the first embodiment, and the SAW resonator 10 is fixed on the upper surface of the protruding section 46 via the adhesive 97. The details of the configuration are common to those of the first embodiment, and consequently, the explanation therefor will be omitted.

The external connection terminal 19*a* of the SAW resonator 10 is connected to the connection terminal 125 of the package base 120, which is formed so as to be drawn from the corresponding electrode pad 145 of the IC chip 140 with the in-layer wiring 129, with the bonding wire 99.

Further, the external connection terminal 19*b* is connected to the connection electrode 65*a* of the extended coil 60 with a bonding wire 99, and since the connection terminal 65*b* of the extended coil 60 and connection terminal 125, which is formed so as to be drawn from the corresponding electrode pad 145 of the IC chip 140 with the in-layer wiring 129, are connected to each other with a bonding wire 99, the external connection terminal 19*b* is connected to the electrode pad 145 via the extended coil 60.

Further, the connection electrode 77 connected to the electrode land 75*b*' and the connection terminal 125 of the package base 120, which is drawn from one of the plurality of electrode pads 145 of the IC chip 140 with the in-layer wiring 129, are connected to each other with the bonding wire 99.

Further, on the upper side of the package base 120, the metal lid 130 is bonded via the seal ring 124 to form the package 109, thereby airtightly encapsulating the IC chip 140 thus bonded and the SAW resonator 10 inside the package base 120.

As described above, in the SAW oscillator 201 according to the second embodiment, since the IC chip 140 is bonded face down to the inside bottom portion of the package base 120, the low-profile chip scale packaging of the IC chip 140 becomes possible.

Thus, in addition to the same advantages as in the first embodiment, further low-profiling of the SAW oscillator 201 can be achieved.

Third Embodiment

Then, an embodiment of a transmitter equipped with either one of the SAW oscillators 1, 101, 102, 201 explained in the first and the second embodiment (the first embodiment includes the modified examples described above, the same applies hereinafter) will hereinafter be explained.

The transmitter is a device for transmitting a signal (an electromagnetic wave) overlapping a data signal to be transmitted, which is generated by the oscillator (the SAW oscillator 1 (101, 102, 201) (hereinafter, description of 101, 102, 201 will be omitted for avoiding botheration)), in the communication device for transmitting and receiving the data signal.

The transmitter is provided with at least the SAW oscillator 1 for outputting a transmission signal, and an antenna for emitting the transmission signal output from the SAW oscillator 1 as an electromagnetic wave. In further detail, the transmitter is provided with an oscillation circuit for stabilizing the predetermined reference frequency of the vibration generated by the SAW oscillator 1, a modulator for modulating the stabilized reference frequency into a signal reflecting content to be transmitted, and an amplifier for amplifying the signal obtained by modulating the reference frequency so as to reflect the content to be transmitted to be a transmission signal, and is configured to emit the transmission signal thus amplified into the air from the antenna as the electromagnetic wave.

The oscillation circuit, the modulator, and the amplifier are formed on a single chip of the IC chip 40 or 140 of the first or the second embodiment as an integrated circuit using an MOS process. Further, as explained in the first or the second embodiment, on the IC chip 40 or 140 bonded inside the package base 20 or 120, there is disposed the circuit wiring connected to the integrated circuit of the IC chip 40 or 140 to form an electric circuit, and further the SAW resonator 10 is fixed thereon in the cantilever support condition. Further, in a part of the circuit wiring, there are formed the extended coil 60 and the plurality of pairs of electrode lands 75*a*, 75*a*', 75*b*, 75*b*', and the circuit component chips 70*a*, 70*b* are bonded correspondingly to the plurality of pairs of electrode lands 75*a*, 75*a*', 75*b*, 75*b*', thereby forming the matching circuit. Further, the metal lid 30 or 130 is bonded on the package base 20 or 120, thus the inside of the package base 20 or 120 is airtightly sealed (see FIGS. 2A, 2B, 3 through 5, 6A, and 6B).

According to the transmitter of the third embodiment described above, since the matching circuit is incorporated therein, a small-sized transmitter with a superior transmission characteristic can be obtained, and the past necessity of providing the matching circuit to the mounting board on the counter part to the board on which the transmitter is mounted can be eliminated.

Although the embodiments of the invention made by the inventors are hereinabove explained specifically, the invention is not limited to each of the embodiments and the modified examples described above, but can variously be modified within the scope or the spirit of the invention.

For example, in the SAW oscillator 1, 101, 102, 201, and the transmitter explained in the embodiments described above, the extended coil 60 is formed on the IC chip 40, 140 by patterning the wiring material to have the spiral shape, thereby forming the inductance in the electric circuit including the oscillation circuit. However, this is not a limitation, and it is also possible to form the wiring material as a coil (an inductive element) having other shapes such that the wiring material is patterned to have a so-called meander line shape. Further, the configuration of forming the electrode lands for inductive element, and mounting the chip type inductive element thereon can also be adopted.

Further, although the quartz crystal is used for the piezoelectric substrate 11 of the SAW resonator 10 explained in the first and second embodiments, this is not a limitation. Besides the quartz crystal, there can be used aluminum nitride (AlN), an oxide substrate such as lithium niobate ($LiNbO_3$), lithium tantalate ($LiTaO_3$), lead zirconium titanate (PZT), or lithium tetraborate ($Li_2B_4O_7$), or a piezoelectric substrate formed by stacking a thin film piezoelectric material such as aluminum nitride or tantalum pentoxide ($Ta_2O_5$) on a glass substrate.

Further, although in the first and second embodiments described above, aluminum is used as the metal material for forming the IDT electrode 12 and the reflectors 13, this is not a limitation. It is also possible to use a metal material such as titanium (Ti), tantalum (Ta), or tungsten (W). Further, a multilayer film of gold (Au) and chromium (Cr), magnesium (Mg), or the like can also be used.

Further, in the first and second embodiments, there is explained the example using a single port type SAW resonator 10 as the piezoelectric resonator element forming a vibration source of the SAW oscillator 1, 101, 102, 201. This is not a limitation, a dual port type SAW resonator, which can be used for a higher frequency band, can also be adopted, or in addition, other SAW element reeds such as a SAW filter or a SAW delay element such as a sensor or a convolver can also be adopted.

Further, in the SAW resonator 10, a configuration without the reflectors 13 can also be adopted. Further, there can be adopted a configuration of using other piezoelectric resonator elements such as a quartz crystal resonator element having a configuration of forming the excitation electrodes on the both principal surfaces of an AT-cut quartz plate or a quartz crystal tuning-fork, besides the SAW element reed such as the SAW resonator.

The entire disclosure of Japanese Patent Application Nos: 2007-186593, filed Jul. 18, 2007, 2008-015871, filed Jan. 28, 2008 and 2008-136339, filed May 26, 2008 are expressly incorporated by reference herein.

What is claimed is:

1. An oscillator, comprising:
   a package;
   a resonator element provided in the package including a substrate; and
   a semiconductor circuit element provided in the package, the semiconductor circuit element comprising:
   an oscillation circuit that oscillates the resonator element;
   a first insulating film provided on a principal surface of the semiconductor circuit element;
   at least a thin film circuit component provided on the first insulating film and connected to the oscillation circuit; and
   at least a second insulating film provided on the first insulating film, wherein
      the resonator element is fixed on a top surface of the second insulating film,
      the first insulating film and the second insulating film are positioned between the resonator element and the principal surface of the semiconductor circuit element, and
      the substrate and the thin film circuit component do not overlap each other.

2. The oscillator as set forth in claim 1, wherein the resonator element is fixed so as to be within a contour of the semiconductor circuit element in plan view.

3. The oscillator as set forth in claim 1, wherein a spacing member is interposed between the principal surface of the semiconductor circuit element and the first insulating film.

4. The oscillator as set forth in claim 1, wherein the thin film circuit component is an inductive element.

5. The oscillator as set forth in claim 4, wherein the inductive element is an extended coil formed by patterning a metal film on the first insulating film.

6. The oscillator as set forth in claim 5, wherein the extended coil is connected between the resonator element and the oscillation circuit.

7. The oscillator as set forth in claim 1, wherein an electrode is formed on the first insulating film, and the electrode is exposed through an opening section provided to the second insulating film.

8. The oscillator as set forth in claim 7, wherein at least a circuit component chip is bonded to the electrode.

9. The oscillator as set forth in claim 8, wherein the semiconductor circuit element is bonded face down to the package.

10. The oscillator as set forth in claim 1, wherein the resonator element is provided with an excitation electrode formed on at least one surface of the substrate, and the excitation electrode is constituted of a metal selected from a group consisting of aluminum, titanium, tantalum, tungsten, and magnesium, or the excitation electrode is includes a laminated film structure of gold and chromium.

11. The oscillator as set forth in claim 10, wherein the substrate is a quartz substrate.

12. The oscillator as set forth in claim 10, wherein the resonator element is a surface acoustic element having an IDT electrode as the excitation electrode.

13. The oscillator as set forth in claim 10, wherein the resonator element is fixed on the second insulating film via an adhesive so that the second insulating film and the excitation electrode do not overlap in plan view.

14. The oscillator as set forth in claim 1, wherein the thin film circuit component is constituted by a metal selected from the group consisting of aluminum, gold, silver, copper, and nickel.

15. The oscillator as set forth in claim 1, wherein the first insulating film is constituted by a resin selected from the group consisting of polyimide resin, silicone modified polyimide resin, epoxy resin, silicone modified epoxy resin, acrylic resin, and phenol resin, and the second insulating film is constituted by a resin selected from the group consisting of polyimide resin, silicone modified polyimide resin, epoxy resin, silicone modified epoxy resin, acrylic resin, and phenol resin.

16. The oscillator as set forth in claim 1, wherein less than all of a bottom surface of the resonator element is fixed on the second insulating film, the resonator element being configured to have empty space between part of the bottom surface of the resonator element and the principal surface of the semiconductor circuit element.

* * * * *